US006757855B1

(12) United States Patent
Rusk et al.

(10) Patent No.: US 6,757,855 B1
(45) Date of Patent: Jun. 29, 2004

(54) INTEGRATED TEST APPARATUS AND METHOD THEREFOR

(75) Inventors: Leland Freddie Rusk, Austin, TX (US); Jeffrey Brinkley, Georgetown, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 563 days.

(21) Appl. No.: 09/828,728

(22) Filed: Apr. 9, 2001

(51) Int. Cl.[7] .................. G01R 31/28; G01R 31/26; G06F 11/00
(52) U.S. Cl. .................. 714/724; 714/40; 370/241
(58) Field of Search .................. 714/724, 733, 714/40; 370/241

(56) References Cited

U.S. PATENT DOCUMENTS

| | | | |
|---|---|---|---|
| 6,167,492 A | 12/2000 | Keller et al. | 711/154 |
| 6,286,114 B1 * | 9/2001 | Veenstra et al. | 714/39 |
| 6,550,033 B1 * | 4/2003 | Dwork | 714/733 |
| 6,584,586 B1 * | 6/2003 | McCoy | 714/45 |
| 6,657,966 B1 * | 12/2003 | Kramarczyk et al. | 370/241 |

* cited by examiner

Primary Examiner—Albert Decady
Assistant Examiner—Cynthia Britt
(74) Attorney, Agent, or Firm—Winstead Sechrest & Minick P.C.

(57) ABSTRACT

An integrated apparatus and method for testing a very large scale integration (VLSI) device is implemented. An interface between automatic test equipment (ATE) and a device under test (DUT) includes a switch and associated control logic that mediates data transfer between high speed buses coupled to the DUT. Additionally, traffic may be switched to a port connected to a bus coupled to the ATE. This bus need not operate at the full speed of the I/O buses of the DUT. The switch also couples to a static random access memory (SRAM) data cache array which may be used for delayed echo of data between ports. Additionally a logic analyzer in the interface may be used in conjunction with the switch and cache to selectively capture data transferred between the DUT and ATE. The configuration of the switch is programmable depending on the testing performed on the DUT.

24 Claims, 3 Drawing Sheets

INTEGRATED TEST APPARATUS AND METHOD THEREFOR

TECHNICAL FIELD

The present invention relates in general to data processing systems, and in particular, to the testing of integrated circuit processing devices.

BACKGROUND INFORMATION

The increased performance in modern processing devices (for example, microprocessors and microcontrollers) complicates the testing and verification of the devices during manufacturing. Typically, testing of a microprocessor, or similar complex very large scale integration (VLSI) device is performed in an automatic test equipment (ATE) environment. Commercial test devices include the Teradyne Model J973 VLSI test system (manufactured by Teradyne, Inc., Boston, Mass.), and the IMS Digital Test Station (manufactured by Integrated Management Systems, Inc., Beaverton, Oreg.). However, with increasing processor speeds, and a concomitant increase in bus speeds, full speed testing of a complex VLSI device in an ATE environment becomes increasingly more complicated. Consequently, there is a need in the art for methods and apparatus for testing VLSI devices at full speed.

SUMMARY OF THE INVENTION

The aforementioned needs are addressed by the present invention. Accordingly, there is provided, in a first form, a test interface apparatus. The apparatus includes a first port having a first maximum data rate and at least one second port having a second maximum data rate. A switching unit within the apparatus is operable for transferring data between the first and at least one second ports and a buffer contained therein in response to a first command signal input to the switching unit.

There is also provided, in a second form, an interface method. The method includes receiving a first data signal operable for configuring a switching unit, and configuring the switching unit in a first configuration in response to a first predetermined value of the first data signal. A first plurality of data values is transferred from a first port to a buffer in response to the first configuration of the switching unit.

Additionally there is provided a test system. The system contains an automatic test equipment (ATE) and an interface apparatus. The interface apparatus includes a first port having a first maximum data rate and at least one second port having a second maximum data rate. The interface apparatus also includes a buffer; and a switching unit operable for transferring data between the first and at least one second ports and the buffer. The first port is operable for transferring a plurality of data values between the ATE and the interface apparatus. The transfer is in response to a first command signal input to the switching unit.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
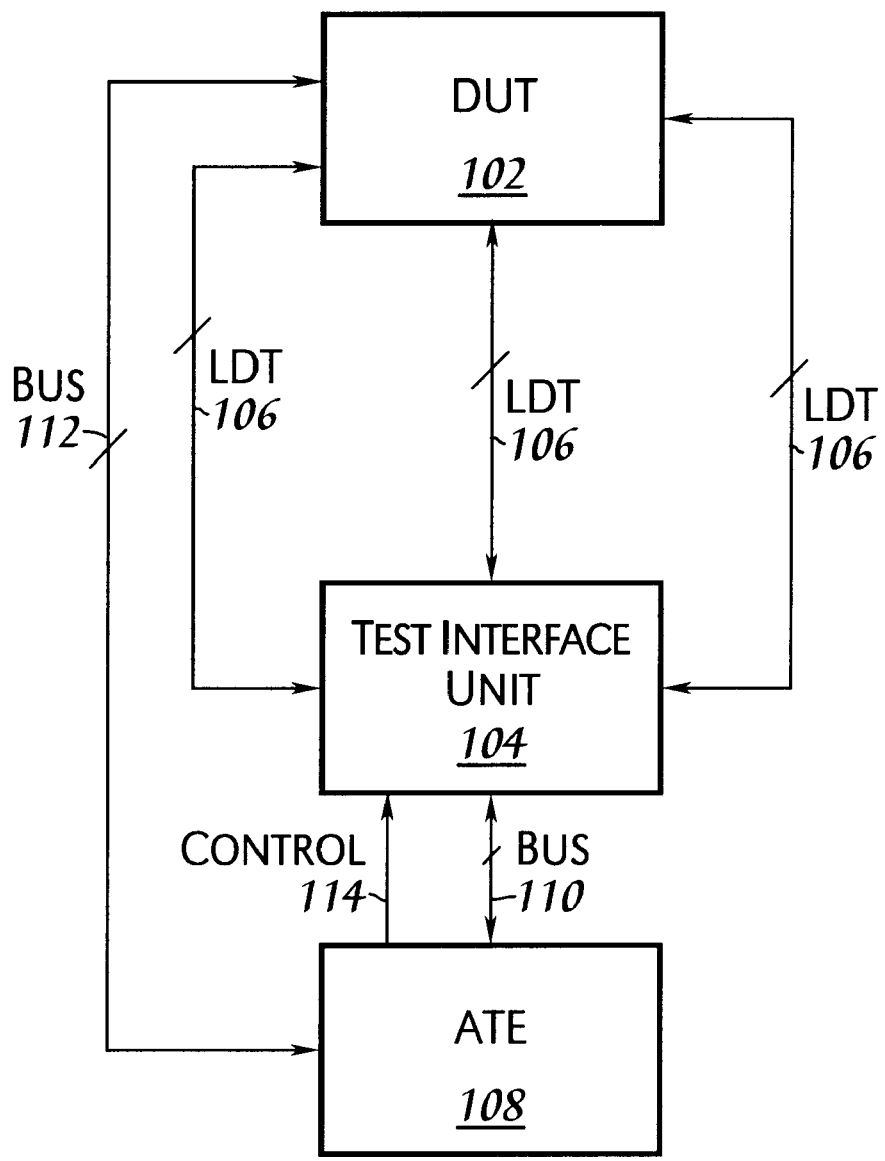
FIG. 1 illustrates, in block diagram form, a test system in accordance with an embodiment of the present invention.

The present invention provides mechanism for testing a very large scale integration (VLSI) device. The test mechanism provides an interface between automatic test equipment (ATE) and a device under test (DUT). A switch and associated control logic mediates data transfer between high speed buses coupled to the DUT. Additionally, traffic may be switched to a port connected to a bus coupled to an ATE. This bus need not operate at the full speed of the input/output (I/O) buses of the DUT. The switches also couple to a static random access memory (SRAM) data cache array. The configuration of the switch is programmable depending on the testing performed on the DUT.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Furthermore, during a description of the implementation, the terms "assert" and "negate" and various grammatical forms thereof, are used to avoid confusion when dealing with a mixture of "active high" and "active low" logic signals. "Assert" is used to refer to the rendering of a logic signal register bit into its active, or logically true, state. "Negate" is used to refer to the rendering of a logic signal or register bit into its inactive, or logically false state.

Refer now to the drawings wherein depicted elements are not necessarily shown to scale and wherein like or similar elements are designated by the same reference numeral through the several views.

Referring now to FIG. 1, there is illustrated a test environment 100 in accordance with the principles of the present invention. In environment 100, DUT 102 is coupled to a test interface unit 104 via a plurality of buses 106. Buses 106 may be high speed data buses, for example, Lightening Data Transport (LDT) buses. A detailed description of the LDT bus is included in the commonly owned U.S. Pat. No. 6,167,492 entitled "Circuit and Method for Maintaining Order of Memory Access Requests Initiated by Devices Coupled to a Microprocessor System", hereby incorporated herein by reference. In an embodiment of an LDT bus, the bus speed may be 800 MHz.

Data is passed to the automatic test equipment, ATE 108, via bus 110. Bus 110 is a bidirectional bus, and may be a double data rate (DDR) memory bus.

Additionally, DUT 102 may be coupled to ATE 108 via bus 112. Bus 112 may also include a DDR memory bus, a southbridge bus, or both. (A southbridge bus would be understood to refer in the art, generically, to a peripheral bus or similar bus which buses are typically understood to be slow in comparison to memory buses, for example.) Data transfer over bus 112 may be used in particular tests of DUT102, and is shown for completeness in test environment 100. However, bus 112 does not contribute to the principles of the present invention, and may be omitted in an alternative embodiment of environment 100 implemented in accordance with the present invention.

Figure 2:
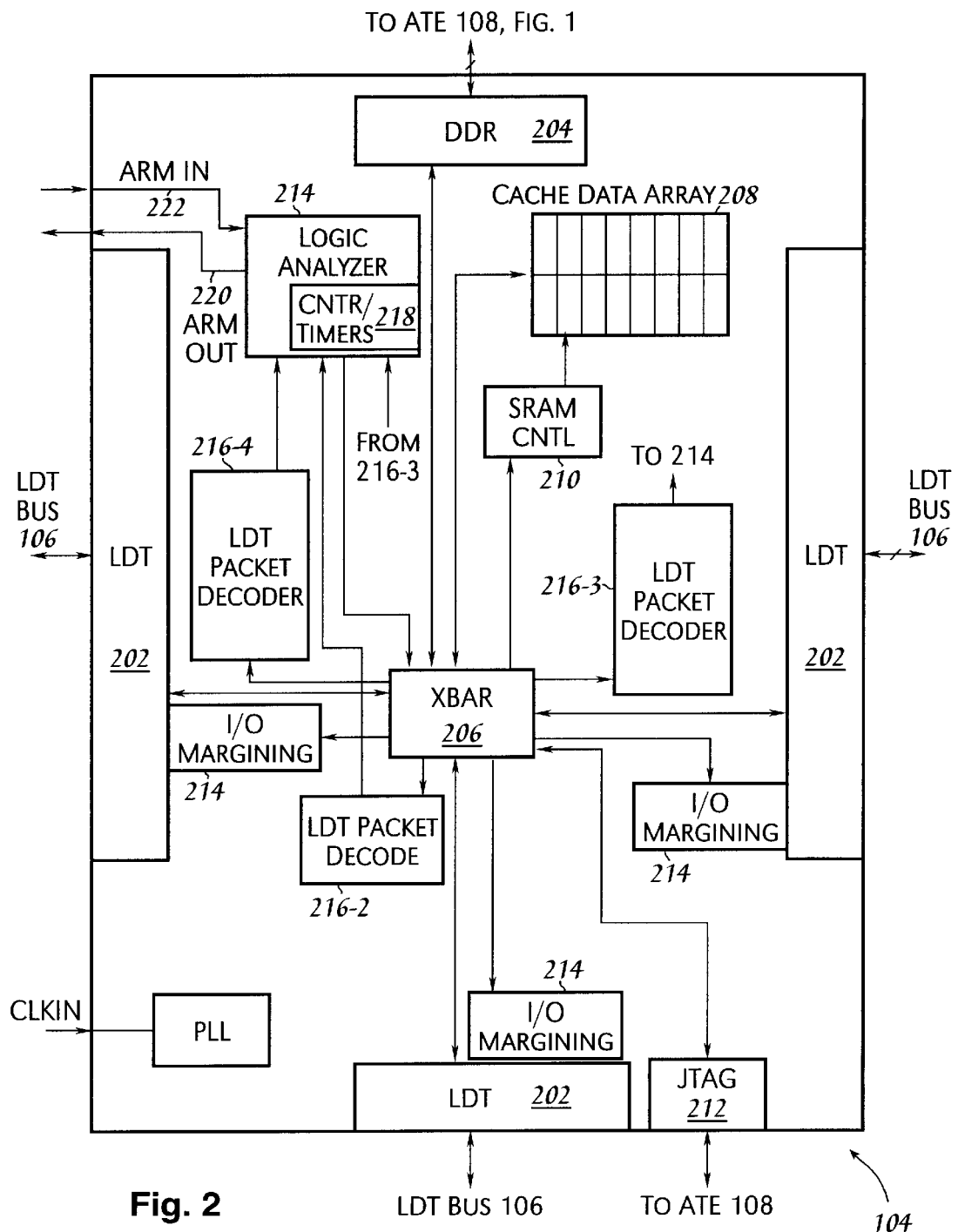
FIG. 2 illustrates, in further detail, a portion of the test system of FIG. 1.

Refer now to FIG. 2 illustrating test interface until 104 in further detail. Test interface unit (TIU) 104 includes three LDT transceivers 202. (An LDT transceiver may also be referred to, simply as an LDT port, for the purposes of the present invention. An alternative embodiment of test interface 204 may include more or fewer than three LDT ports, and, as would be understood by an artisan of ordinary skill, such embodiments would fall within the spirit and scope of the present invention. Additionally, test interface unit 104 includes DDR port 204. TIU 104 may be coupled to ATE 108, FIG. 1 via port 204. Communications between LDT ports 202 and DDR port 204 is mediated by cross bar (XBAR) unit 206 which includes a cross bar switch and control logic therefor. For example, data may be received from the ATE such as ATE 108, FIG. 1, via DDR port 204. The data received from the ATE may then be driven out to the DUT at full speed through one of LDT ports 202 via XBAR unit 206.

Conversely, data may be sent to the ATE, for example ATE 108 in FIG. 1, from the DUT, with the DUT driving data at full speed, on one of LDT buses 106. Data may be received by the corresponding one of LDT ports 202 and buffered into cache data array 208 via XBAR unit 206. SRAM control 210 enables data cache array 208 for writing and sets the pointer, or address, into the cache. Data and/or instructions may be buffered in the cache array. SRAM control 210 controls the direction of cache access (read/write) between cache array 208 and DDR 204 or LDT 206 depending on the operation selected, as discussed below. XBAR unit 206 then reads the buffered data from cache data array 208 and communicates the data to DDR port 204 for transmission to the ATE.

XBAR unit 206 is programmable to select between LDT ports 202 and between an LDT port 202 and DDR 204. XBAR unit 206 is configured via JTAG interface. Additionally, the speed of the links may be controlled via XBAR unit 206 and JTAG interface 212. Control information is passed between the ATE and TIU 104 via JTAG interface 212. In this way, the user, that is, the programmer of the ATE, may configure the TIU in accordance with a test plan. Communication via JTAG interface 212 may be bidirectional in an embodiment of the present invention whereby the ATE may read back control information from the TIU, such as TIU 104.

JTAG interface 212 also provides the control mechanism for input/output (I/O) margining. The I/O margining apparatus provides for the test of the I/O specifications on the DUT. Via the JTAG and XBAR unit 206, I/O margining registers are set. The data set in I/O margining registers 214 control the introduction of skew in the timings of the data transferred through LDT ports 202. Phase lock loop 211 provides the clock for TIU 104 which is locked to a clock from ATU 108 via CLKIN 213.

Test interface unit 104 also includes a logic analyzer 214. Logic analyzer 214 may be a minimal state machine and, in conjunction with LDT packet decoders 216 and counters and timers which may be included in logic analyzer 214 provide for selective capture of LDT packets. Logic analyzer 214 receives control information through JTAG interface 212 via XBAR 206. The control information may be used to enable the arming of an external logic analyzer, as discussed further below. (The LDT protocol provides for packetized data transfer on LDT buses 106. LDT packets include control packets, info packets and data packets having a predetermined structure in accordance with the LDT specification. The LDT bus is included in the commonly owned U.S. Pat. No. 6,167,492 entitled "Circuit and Method for Maintaining Order of Memory Access Requests Initiated by Devices Coupled to a Microprocessor System," incorporated herein by reference.) Packet decoders 216 receive LDT packets via XBAR unit 206 and decode the LDT packets. The LDT specification provides for a multiplicity of packet types. The data payload for a data transaction is contained in data packets. Additionally, the LDT specification provides for control packets, which include info packets and command packets. Flow control information, and synchronization information are included in info packets. Command packets specify the type of transaction to be performed, for example, a read request or a write request, and may include additional information that control communication link parameters for the transaction.

In the course of a debug operation, it may be determined that the DUT fails with doing a particular type of packet transfer. LDT packet decoders 216 may be configured via the JTAGs and control logic in the XBAR unit 206 to detect the packet type of interest, and initiate the logic analyzer 214. Logic analyzer 214 may then detect the preselected logic states on the buses, and via XBAR unit 206 initiate selective capture of the data into cache array 208. Additionally, an external logic analyzer (not shown) may be enabled via arm out 220. A logic analyzer 214 may trigger an external logic analyzer based on minimal sequence and logical conditions. For example, it may be determined through system debug, that a particular combination of data is causing a system failure. The logic analyzer may be programmed to "snoop" for the particular combination, wherein logic analyzer 214 may arm an external analyzer on detection of the particular combination, via arm out 220. The presence of an external logic analyzer may be communicated to logic analyzer 214 via arm in 222.

Figure 3:
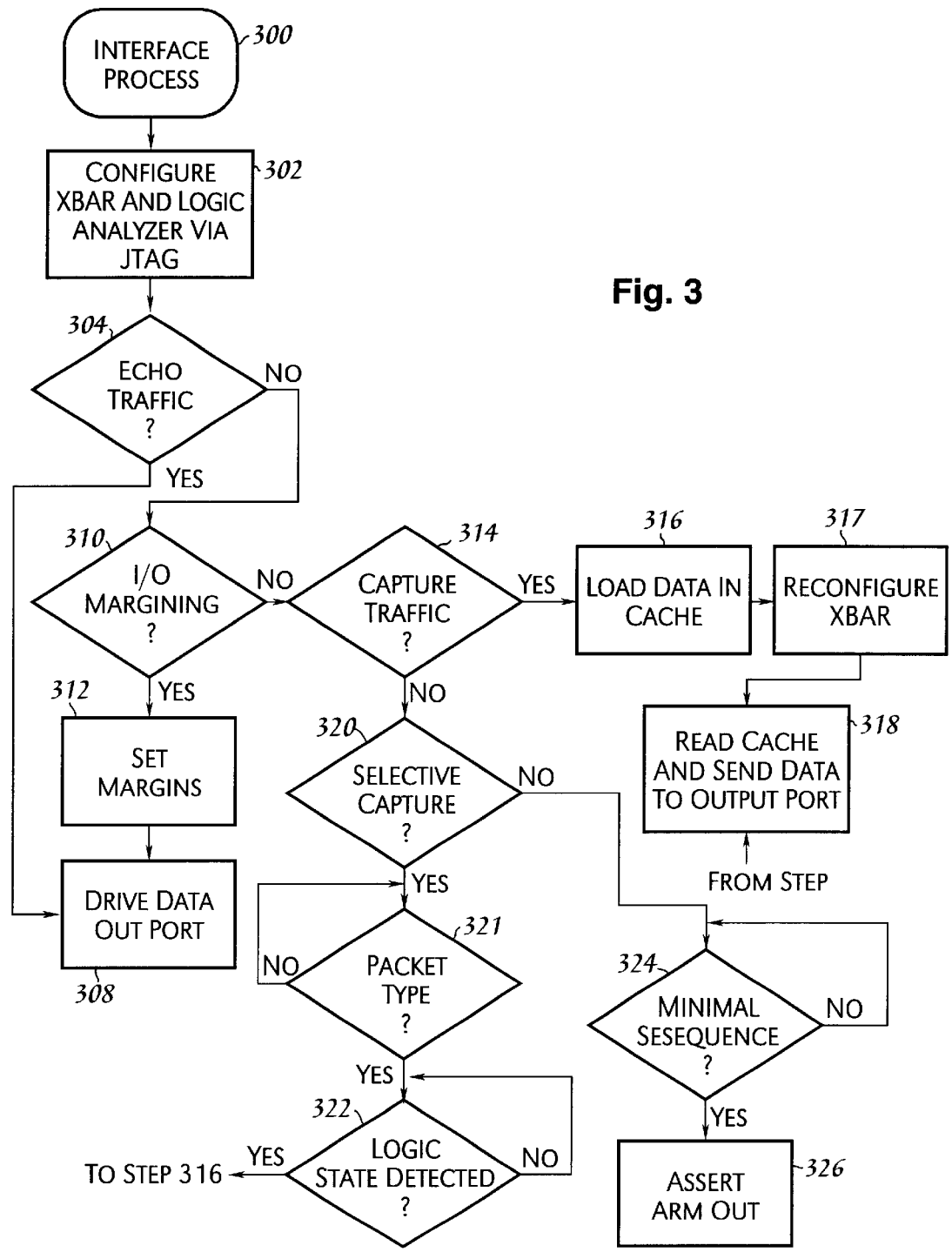
FIG. 3 illustrates in flow chart form a test methodology in accordance with an embodiment of the present invention.

Refer now to FIG. 3 illustrating, in flow chart form, an integrated test methodology 300 in accordance with the principles of the present invention. In step 302, XBAR unit 206, FIG. 2, and logic analyzer 214 are configured in accordance with the tests to be performed on the DUT. The configuration of the XBAR unit 206 and logic analyzer 214 may be performed by providing the corresponding JTAG signals via JTAG interface 212, as discussed hereinabove in conjunction with FIG. 2.

If, in step 304, interface unit 104 is configured to echo traffic from an LDT bus 106, in step 308, the data is driven out a preselected port in accordance with configuration step 302. In echoing traffic from the DUT to the ATE, data may be driven out DDR port 204, FIG. 2 in an embodiment in accordance with TIU 104.

If, step 310, and I/O margining test is to be performed, the margins are set in step 312. Recall that the I/O margins may be set, by storing a preselected data value in a corresponding one of I/O margining registers 214, FIG. 2. The preselected margin may be provided in a JTAG signal via JTAG interface 212, FIG. 2. The data, which may be communicated from the ATE, for example, ATE 108, FIG. 1 and sent to the DUT via interface 104 may be received through DDR port 204, and, in step 308 driven out a corresponding one of LDT ports 202. The data received on DDR port 204 may be provided to the corresponding one of LDT ports 202 via XBAR unit 206, in response to configuration step 302.

Additionally, TIU 104 may be configured to capture data into cache 208, FIG. 2, for delayed echoing onto the DDR port. If, step 314, the interface apparatus in accordance with the present invention is configured to capture traffic, in step 316 the data is loaded into the data cache array, such as data cache array 208, FIG. 2. In an embodiment of the present invention in accordance with TIU 104 illustrated in FIG. 2, SRAM control 210 selects for a write to the data cache array 208 and outputs a write pointer thereto. When the data has been received XBAR unit 206 may be reconfigured, step 317, to transfer data from data cache array 208 to a selected output port which may be DDR port 204. SRAM control 210 selects for reading from data cache array 208, and, outputs a read pointer, or address, to data cache array 208. In step 318, data is read from the data cache array and sent via XBAR unit 206 to the selected output port.

TIU 104 may also be configured to selectively capture data using state machine 214, in an embodiment of the present invention in accordance with interface 104 in FIG. 2. If, in step 320, the interface of the present invention is configured to selectively capture data, LDT ports 202 are snooped for a preselected type of data transaction. The preselected transaction type may be defined in configuration step 302. As discussed hereinabove in conjunction with FIG. 2, LDT communications are packetized and LDT decoders 216 decode the LDT packets, and detect the preselected transaction type wherein step 321 breaks out of a loop, and in step 322, methodology 300 loops until a preselected logic state is detected on the bus being snooped, which may be one of LDT buses 106, FIG. 1. Step 322 may be performed, in an embodiment of the present invention in accordance with TIU 104 in FIG. 2 by state machine 214, enabled in response to detection of the preselected transaction type in step 321. The preselected logic state may be defined in configuration step 302. In step 316, the received data is loaded into data cache array 208, as previously described. Data may then be read from the cache and sent to the output port, steps 317 and 318, discussed above.

Alternatively, the interface apparatus in accordance with the present invention may be configured to arm an external logic analyzer ("No" branch, step 320) in response to preselected minimal sequences or logic conditions. In step 324, methodology 300 loops until a preselected sequence or logic condition, set in configuration step 302, is detected on the snooped bus which may be an LDT bus 106 coupled to one of LDT ports 202, FIG. 2. On detection of the preselected minimal sequence, or logic condition, an arm out signal is asserted, step 326.

In this way, an integrated test apparatus, and method therefore are provided. The apparatus, which is configurable in response to external controls, which may be JTAG signals, depending on the test being run on the DUT. The data may be echoed from an LDT port, or similar high speed port, to a lower speed port, such as a DDR port, and may include a delayed echo with data capture to account for data rate mismatches, for example. Furthermore, selective capture of data maybe performed using a configurable logic analyzer, which may also be configured to trigger an external logic analyzer in response to preselected data sequences or logical conditions.

Although the present invention and its advantages have been described in detail, it should be understood that various changes, substitutions and alterations can be made herein without departing from the spirit and scope of the invention as defined by the appended claims.

What is claimed:

1. An interface apparatus comprising:
   a first port having a first maximum data rate;
   at least one second port having a second maximum data rate;
   a buffer;
   a switching unit operable for transferring data between said first and at least one second ports and said buffer in response to a first command signal input to said switching unit;
   a logic analyzer; and
   at least one packet decoder operable for decoding signals received on said at least one second port, wherein said second port is operable for communicating signals in a packetized form, said packet decoder enabling said logic analyzer in response to a preselected packet type.

2. The apparatus of claim 1 wherein said switching unit includes control logic for configuring said switching unit in response to said first command signal.

3. The apparatus of claim 1 further comprising a command signal interface operable for receiving said first command signal in response to user input and sending a second command signal to said switching unit, said switching unit transferring data in response to said second command signal.

4. The apparatus of claim 3 wherein said command signal interface comprises a JTAG interface.

5. The apparatus of claim 1 wherein said logic analyzer is operable for detecting a preselected set of data encapsulated in one or more packets, said logic analyzer enabling said switching unit for communicating a set of data received on a first one of said at least one second port to said buffer.

6. The apparatus of claim 1 wherein said first maximum data rate is less than said second maximum data rate.

7. An interface apparatus comprising:
   a first port having a first maximum data rate;
   at least one second port having a second maximum data rate;
   a buffer; and
   a switching unit operable for transferring data between said first and at least one second ports and said buffer in response to a first command signal input to said switching unit, wherein said at least one second port is operable for introducing a timing skew in an output signal transmitted from said at least one second port, said timing skew introduced in response to a data value received from said switching unit.

8. The apparatus of claim 7 further comprising a register operable for receiving said data value received from said switching unit, said at least one second port introducing an amount of said timing skew determined by a value held in said register.

9. An interface apparatus comprising:
   a first port having a first maximum data rate;
   at least one second port having a second maximum data rate;
   a buffer; and
   a switching unit operable for transferring data between said first and at least one second ports and said buffer in response to a first command signal input to said switching unit,
   wherein said at least one second port is at least one Lightning Data Transport (LDT) port.

10. An interface method comprising the steps of:
    receiving a first data signal operable for configuring a switching unit;

configuring said switching unit in a first configuration in response to a first predetermined value of said first data signal;

transferring a first plurality of data values from a first port to a buffer in response to said first configuration of said switching unit; and selectively storing a portion of said first plurality of data values in said buffer in response to a preselected type of transaction for transferring said first plurality of data values, wherein said first plurality of data values comprises a plurality of first packets wherein each packet of said plurality of first packets encapsulates one or more data values of said first plurality of data values and one or more second packets, each second packet operable for controlling a type of bus transaction, and wherein said step of selectively storing said portion of said first plurality of data values comprises the steps of:
decoding said one or more second packets;
transferring said portion of said first plurality of data values to said buffer in response to said detecting step.

11. The method of claim 10 further comprising the steps of:
configuring said switching unit in a second configuration in response to a second predetermined value of said first data signal; and
transferring said first plurality of data values from said buffer to a second port in response to said second configuration of said switching unit.

12. The method of claim 10 further comprising the steps of:
configuring said switching unit in a second configuration in response to a second predetermined value of said first data signal; and
transferring said first plurality of data values from said first port to a second port in response to said second configuration of said switching unit.

13. The method of claim 12 further comprising the steps of:
receiving a second data signal operable for determining a timing skew of an output signal from said second port; and
adjusting a margin of said output data signal in response to said timing skew.

14. The method of claim 10 wherein said step of transferring said portion of said first plurality of data values includes the step of reconfiguring said switching unit in said first configuration.

15. A test system comprising:
an automatic test equipment (ATE); and
an interface apparatus, said interface apparatus comprising:
a first port having a first maximum data rate;
at least one second port having a second maximum data rate;
a buffer; and
a switching unit operable for transferring data between said first and at least one second ports and said buffer in response to a first command signal input to said switching unit, wherein said first port is operable for transferring a plurality of data values between said ATE and said interface apparatus, wherein said at least one second port is operable for introducing a timing skew in an output signal transmitted from said at least one second port, said timing skew introduced in response to a data value received from said switching unit.

16. The system of claim 15 further comprising a device under test (DUT) wherein said second port is operable for transferring said plurality of data values between said interface apparatus and said DUT.

17. The system of claim 15 wherein said switching unit includes control logic for configuring said switching unit in response to said first command signal.

18. The system of claim 15 further comprising a command signal interface operable for receiving said first command signal in response to user input and sending a second command signal to said switching unit, said switching unit transferring data in response to said second command signal.

19. The system of claim 18 wherein said command signal interface comprises a JTAG interface.

20. The system of claim 15 further comprising a register operable for receiving said data value received from said switching unit, said at least on second port introducing an amount of said timing skew determined by a value held in said register.

21. The system of claim 15 wherein said first maximum data rate is less than said second maximum data rate.

22. A test system comprising:
an automatic test equipment (ATE); and
an interface apparatus said interface apparatus comprising:
a first port having a first maximum data rate;
at least one second port having a second maximum data rate;
a buffer; and
a switching unit operable for transferring data between said first and at least one second ports and said buffer in response to a first command signal input to said switching unit,
wherein said first port is operable for transferring a plurality of data values between said ATE and said interface apparatus;
a logic analyzer; and
at least one packet decoder operable for decoding signals received on said at least one second port, wherein said second port is operable for communicating signals in a packetized form, said packet decoder enabling said logic analyzer in response to a preselected packet type.

23. The system of claim 22 wherein said logic analyzer is operable for detecting a preselected set of data encapsulated in one or more packets, said logic analyzer enabling said switching unit for communicating a set of data received on a first one of said at least one second port to said buffer.

24. A test system comprising:
an automatic test equipment (ATE); and
an interface apparatus, said interface apparatus comprising:
a first port having a first maximum data rate;
at least one second port having a second maximum data rate;
a buffer; and
a switching unit operable for transferring data between said first and at least one second ports and said buffer in response to a first command signal input to said switching unit,
wherein said first port is operable for transferring a plurality of data values between said ATE and said interface apparatus, wherein said at least one second port is at least one Lightning Data Transport (LDT) port.

* * * * *

UNITED STATES PATENT AND TRADEMARK OFFICE
CERTIFICATE OF CORRECTION

PATENT NO. : 6,757,855 B1 Page 1 of 1
DATED : June 29, 2004
INVENTOR(S) : Leland Freddie Rusk and Jeffrey Brinkley It is certified that error appears in the above-identified patent and that said Letters Patent is hereby corrected as shown below:

<u>Column 8,</u>
Line 24, following "apparatus" please insert -- , --.

Signed and Sealed this

Thirtieth Day of November, 2004

JON W. DUDAS
*Director of the United States Patent and Trademark Office*